United States Patent

Shindo

(10) Patent No.: US 10,775,697 B2
(45) Date of Patent: Sep. 15, 2020

(54) RADIATION-SENSITIVE RESIN COMPOSITION, RESIN FILM, AND ELECTRONIC DEVICE

(71) Applicant: ZEON CORPORATION, Tokyo (JP)

(72) Inventor: Hiroaki Shindo, Tokyo (JP)

(73) Assignee: ZEON CORPORATION, Tokyo (JP)

(*) Notice: Subject to any disclaimer, the term of this patent is extended or adjusted under 35 U.S.C. 154(b) by 0 days.

(21) Appl. No.: 15/305,560

(22) PCT Filed: Apr. 20, 2015

(86) PCT No.: PCT/JP2015/061969
§ 371 (c)(1),
(2) Date: Oct. 20, 2016

(87) PCT Pub. No.: WO2015/163276
PCT Pub. Date: Oct. 29, 2015

(65) Prior Publication Data
US 2017/0038681 A1    Feb. 9, 2017

(30) Foreign Application Priority Data

Apr. 22, 2014 (JP) ................. 2014-087994

(51) Int. Cl.
| | | |
|---|---|---|
| *G03F 7/023* | (2006.01) | |
| *G03F 7/038* | (2006.01) | |
| *G03F 7/022* | (2006.01) | |
| *C08J 5/18* | (2006.01) | |
| *C08K 5/34* | (2006.01) | |
| *C08L 63/00* | (2006.01) | |
| *C08L 101/00* | (2006.01) | |
| *C08K 5/3475* | (2006.01) | |
| *C08K 5/3492* | (2006.01) | |

(52) U.S. Cl.
CPC ............ *G03F 7/0233* (2013.01); *C08J 5/18* (2013.01); *C08K 5/3475* (2013.01); *C08K 5/3492* (2013.01); *C08L 63/00* (2013.01); *C08L 101/00* (2013.01); *G03F 7/0226* (2013.01); *G03F 7/038* (2013.01); *C08J 2345/00* (2013.01); *G03F 7/023* (2013.01)

(58) Field of Classification Search
CPC ........ G03F 7/0233; G03F 7/038; G03F 7/023; G03F 7/0226; C08J 5/18; C08J 2345/00; C08L 63/00; C08L 101/00; C08K 5/3492; C08K 5/3475
See application file for complete search history.

(56) References Cited

U.S. PATENT DOCUMENTS

| | | | |
|---|---|---|---|
| 5,705,641 A | 1/1998 | Flood et al. | |
| 5,852,133 A * | 12/1998 | Gupta | C08F 8/30 525/327.3 |
| 2004/0265733 A1* | 12/2004 | Houlihan | G03F 7/0045 430/270.1 |
| 2006/0040201 A1* | 2/2006 | Kurakata | G03F 7/0382 430/270.1 |
| 2014/0141375 A1* | 5/2014 | Cho | G03F 7/0046 430/286.1 |
| 2015/0051325 A1 | 2/2015 | Konishi et al. | |

FOREIGN PATENT DOCUMENTS

| | | | | |
|---|---|---|---|---|
| JP | 07-002804 A | | 1/1995 | |
| JP | 10-147744 | * | 6/1998 | |
| JP | 10-319591 A | | 12/1998 | |
| JP | 11-500773 A | | 1/1999 | |
| JP | 2002-249646 A | | 9/2002 | |
| JP | 2010-224533 | * | 10/2010 | ............ G03F 7/004 |
| JP | 2012-049300 | * | 3/2012 | ........... H01L 21/312 |
| JP | 2013-163769 A | | 8/2013 | |
| WO | 2011/014011 | * | 2/2011 | ........... G03F 7/0035 |
| WO | 2011-040324 A | | 4/2011 | |

OTHER PUBLICATIONS

Machine Translation of JP 10-319591 (1998).*
International Search Report dated Jun. 23, 2015 issued in counterpart application No. PCT/JP2015/061969. (2 pages).

* cited by examiner

*Primary Examiner* — Martin J Angebranndt
(74) *Attorney, Agent, or Firm* — Westerman, Hattori, Daniels & Adrian, LLP

(57) ABSTRACT

There are provided a radiation-sensitive resin composition comprising a binder resin (A), radiation-sensitive compound (B), and cross-linking agent (C) represented by the following general formula (1), wherein a content of the cross-linking agent (C) is 3 to 25 parts by weight with respect to 100 parts by weight of the binder resin (A):

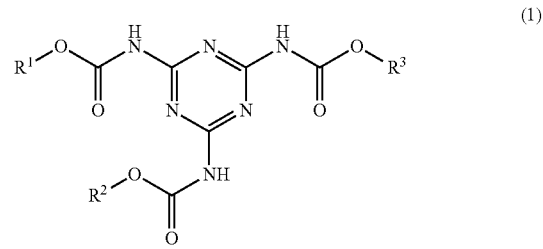

(1)

wherein, in the general formula (1), each of $R^1$ to $R^3$ independently represents a hydrocarbon group having 1 to 10 carbon atoms.

7 Claims, No Drawings

RADIATION-SENSITIVE RESIN COMPOSITION, RESIN FILM, AND ELECTRONIC DEVICE

TECHNICAL FIELD

The present invention relates to a radiation-sensitive resin composition and to a resin film and electronic device obtained using this radiation-sensitive resin composition, more particularly relates to a radiation-sensitive resin composition able to give a resin film high in exposure sensitivity, low in coefficient of water absorption, and excellent in patternability by development and UV ozone treatment resistance and to a resin film and electronic device obtained using this radiation-sensitive resin composition.

BACKGROUND ART

Electronic devices such as display devices, integrated circuit devices, solid imaging devices, color filters, and black matrices are provided with various resin films such as protective films for preventing deterioration or damage, flattening films of boards having devices or interconnects for flattening relief due to devices or interconnects, and electrical insulating films for maintaining electrical insulation. Devices such as thin film transistor type liquid crystal display devices and integrated circuit devices are provided with resin films as interlayer insulating films for insulating among pluralities of interconnects arranged in layers. Further, as the constitution of an organic EL device and light emitting device, a constitution including an anode/hole injection-transport layer/organic light emitting layer/electron injection-layer/cathode is general. Around the light emitting parts, for electrically insulating from other devices and interconnects, pixel separation films (also called "pixel defining films" and "device separation films") are provided. Between the active devices such as transistors and the anodes, flattening films are provided. In the past, as the material for forming these resin films, various radiation-sensitive resin compositions have been used.

For example, Patent Document 1 discloses a radiation-sensitive resin composition comprising an alkali soluble resin, a cross-linking agent having a triazine ring structure and having a methylol group or alkoxyalkyl group, and a radiation-sensitive acid generator. According to Patent Document 1, it is disclosed that this radiation-sensitive resin composition is excellent in various performances such as insulation, flatness, heat resistance, transparency, and chemical resistance.

However, in the radiation-sensitive resin composition disclosed in this Patent Document 1, the patternability by development is not necessarily sufficient. Furthermore, after patterning by development, there is large deterioration when washing using UV ozone treatment. For this reason, this is not suitable for applications requiring washing using UV ozone treatment, for example, applications for pixel separation films of organic EL devices.

RELATED ART DOCUMENTS

Patent Documents

Patent Document 1: Japanese Patent Publication No. 2002-249646A

SUMMARY OF THE INVENTION

Problem to be Solved by the Invention

The present invention has as its object the provision of a radiation-sensitive resin composition able to give a resin film high in exposure sensitivity, low in coefficient of water absorption, and excellent in patternability by development and UV ozone treatment resistance. Further, the present invention has as its object the provision of a resin film obtained using such a radiation-sensitive resin composition and an electronic device provided with that resin film.

Means for Solving the Problem

The present inventors engaged in intensive research to achieve the above object and as a result discovered that by mixing a specific urethane bond-containing triazine-based compound in a specific ratio with respect to the binder resin together with the radiation-sensitive compound, it is possible to achieve the above object and thereby completed the present invention.

That is, according to the present invention, there are provided

[1] a radiation-sensitive resin composition comprising a binder resin (A), radiation-sensitive compound (B), and cross-linking agent (C) represented by the following general formula (1), wherein a content of the cross-linking agent (C) is 3 to 25 parts by weight with respect to 100 parts by weight of the binder resin (A):

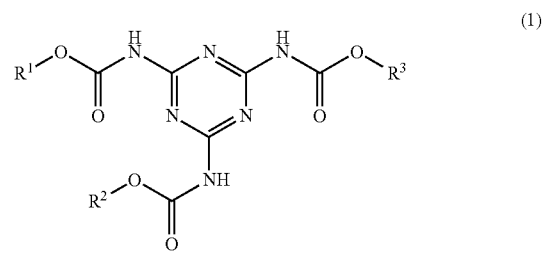

(1)

wherein, in the general formula (1), each of $R^1$ to $R^3$ independently represents a hydrocarbon group having 1 to 10 carbon atoms.

[2] The radiation-sensitive resin composition according to [1] wherein in the general formula (1), each of $R^1$ to $R^3$ is a methyl group and/or n-butyl group.

[3] The radiation-sensitive resin composition according to [1] or [2] further comprising a cross-linking agent (D) having a triazine ring structure or glycoluril structure and having one or more types of functional groups selected from a group consisting of a methylol group and alkoxyalkyl group.

[4] The radiation-sensitive resin composition according to [3] wherein the cross-linking agent (D) is a compound having a melamine structure represented by the following general formula (6) and/or a compound having a guanamine structure represented by the following general formula (7):

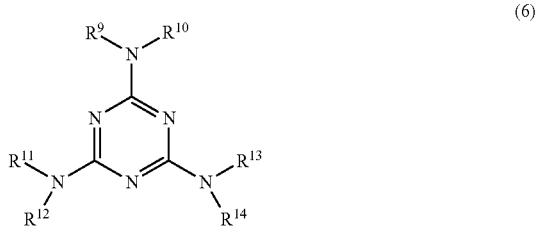

(6)

wherein, in the general formula (6), each of $R^9$ to $R^{14}$ independently represents a hydrogen atom, substituted or unsubstituted alkyl group, substituted or unsubstituted aryl group, methylol group, or alkoxyalkyl group, among $R^9$ to $R^{14}$, at least one being a methylol group or alkoxyalkyl group:

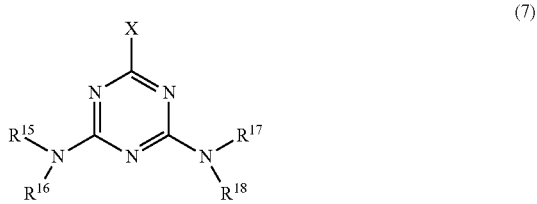

(7)

wherein, in the general formula (7), each of $R^{15}$ to $R^{18}$ independently represents a hydrogen atom, substituted or unsubstituted alkyl group, substituted or unsubstituted aryl group, methylol group, or alkoxyalkyl group, among $R^{15}$ to $R^{18}$, at least one being a methylol group or alkoxyalkyl group. X represents a hydrogen atom, substituted or unsubstituted alkyl group, or substituted or unsubstituted aryl group.

[5] The radiation-sensitive resin composition according to [3] or [4] wherein a content of the cross-linking agent (D) is 15 to 45 parts by weight with respect to 100 parts by weight of the binder resin (A).

[6] The radiation-sensitive resin composition according to any one of [1] to [5] further comprising an epoxy compound (E).

[7] The radiation-sensitive resin composition according to [6] wherein a content of the epoxy compound (E) is 3 to 70 parts by weight with respect to 100 parts by weight of the binder resin (A).

[8] A resin film obtained using the resin composition according to any one of [1] to [7].

[9] An electronic device provided with the resin film according to [8].

Effects of the Invention

According to the present invention, it is possible to provide a radiation-sensitive resin composition able to give a resin film high in exposure sensitivity, low in coefficient of water absorption, and excellent in patternability by development and UV ozone treatment resistance, a resin film obtained using such a radiation-sensitive resin composition, and an electronic device provided with such a resin film.

DESCRIPTION OF EMBODIMENTS

The radiation-sensitive resin composition of the present invention comprises a binder resin (A), a radiation-sensitive compound (B), and a cross-linking agent (C) represented by the following general formula (1), wherein a content of the cross-linking agent (C) is 3 to 25 parts by weight with respect to 100 parts by weight of the binder resin (A).

(Binder Resin (A))

The binder resin (A) used in the present invention is not particularly limited, but a cyclic olefin polymer which has a protonic polar group (A1), an acrylic resin (A2), Cardo resin (A3), polysiloxane (A4), or polyimide (A5) is preferable. Among these as well, a cyclic olefin polymer which has a protonic polar group (A1) is particularly preferable. These binder resins (A) may respectively be used alone or as two types or more combined.

As the cyclic olefin polymer which has a protonic polar group (A1) (below, simply referred to as the "cyclic olefin polymer (A1)"), a polymer of one or more cyclic olefin monomers or a copolymer of one or more cyclic olefin monomers and a monomer which can copolymerize with them may be mentioned, but in the present invention, as the monomer for forming the cyclic olefin polymer (A1), it is preferable to use at least a cyclic olefin monomer which has a protonic polar group (a).

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Periodic Table are preferable, an oxygen atom, nitrogen atom, or sulfur atom is more preferable, and an oxygen atom is particularly preferable.

As specific examples of such a protonic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable. In the present invention, the number of protonic polar groups which bond with the cyclic olefin resin which has protonic polar groups is not particularly limited. Further, different types of protonic polar groups may also be included.

As specific examples of the cyclic olefin monomer which has a protonic polar group (a) (below, suitably called the "monomer (a)"), 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.11]hept-5-ene, 2-hydroxycarbonyl-3-biphenyloxycarbonylbicyclo[2.2.11]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxymethyl-2-hydroxycarbonylbicyclo[2.2.1]hept-5-ene, 2-hydroxycarbonyltricyclo[5.2.1.$0^{2,6}$]deca-3,8-diene, 4-hydroxycarbonyltetracyclo[6.2.1.$1^{3,6}.0^{2,7}$]dodec-9-ene, 4-methyl-4-hydroxycarbonyltetracyclo[6.2.1.$1^{3,6}.0^{2,7}$]dodec-9-ene, 4,5-dihydroxycarbonyltetracyclo[6.2.1.$1^{3,6}.0^{2,7}$]dodec-9-ene, 4-carboxymethyl-4-hydroxycarbonyltetracyclo[6.2.1.$1^{3,6}.0^{2,7}$]dodec-9-ene, N-(hydroxycarbonylmethyl)bicyclo[2.2.1]hept-5-ene-2,3-dicarboxyimide, N-(hydroxycarbonylethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl) bicyclo[2.2.1]hept-5-ene-2,3-dicarboxyimide, N-(dihydroxycarbonylpropyl) bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, N-(hydroxycarbonylphenyl)bicyclo[2.2.1]hept-5-ene-2,3-dicarboxyimide, and other carboxy group-containing cyclic olefins; 2-(4-hydroxyphenyl) bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.$1^{3,6}.0^{2,7}$]dodec-9-ene, 4-methyl-4-(4-hydroxyphenyl)tetracyclo[6.2.1.$1^{3,6}.0^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.11]hept-5-ene, 2-methyl-2-hydroxymethylbicyclo[2.2.11]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.$0^{2,6}$]deca-4,8-diene, 3-hydroxymethyltricyclo[5.2.1.$0^{2,6}$]deca-4,8-diene, 4-hydroxytetracyclo[6.2.1.$1^{3,6}.0^{2,7}$]dodec-9-ene, 4-hydroxymethyltetracyclo[6.2.1.$1^{3,6}.0^{2,7}$]dodec-9-ene, 4,5-dihydroxymethyltetracyclo[6.2.1.$1^{3,6}.0^{2,7}$]dodec-9-ene, 4-(hydroxyethoxycarbonyl)tetracyclo[6.2.1.$1^{3,6}.0^{2,7}$]dodec-9-ene, 4-methyl-4-(hydroxyethoxycarbonyl)tetracyclo[6.2.1.$1^{3,6}.0^{2,7}$]dodec-9-ene, N-(hydroxyethyl)bicyclo[2.2.1]hept-5-ene-2,3-dicarboxyimide, N-(hydroxyphenyl)bicyclo[2.2.1]hept-5-ene-2,3-dicarboxyimide, and other hydroxyl group-containing cyclic olefins etc. may be mentioned. Among these as well, from the viewpoint of the adhesion of the obtained resin film becoming higher, carboxy group-containing cyclic olefins are preferable, while 4-hydroxycarbonyltetracyclo[6.2.1.$1^{3,6}.0^{2,7}$]dodec-9-ene is particularly preferable. These monomers (a) may respectively be used alone or may be used as two types or more combined.

In the cyclic olefin polymer (A1), the ratio of content of the units of the monomer (a) is preferably 10 to 90 mol % with respect to all monomer units. If ratio of content of the units of the monomer (a) is too small, heat resistance is liable to become insufficient, while if too great, the cyclic olefin polymer (A1) is liable to become insufficient in solubility in a polar solvent.

Further, the cyclic olefin polymer (A1) used in the present invention may be a copolymer which is obtained by copolymerization of a cyclic olefin monomer which has a protonic polar group (a) and a monomer (b) which can copolymerize with this. As such a copolymerizable monomer (b), a cyclic olefin monomer which has a polar group other than a protonic polar group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than a protonic polar group (b1), for example, a cyclic olefin which has an N-substituted imide group, ester group, cyano group, acid anhydride group, or halogen atom may be mentioned.

As a cyclic olefin which has an N-substituted imide group, for example, a monomer represented by the following formula (2) or a monomer represented by the following formula (3) may be mentioned.

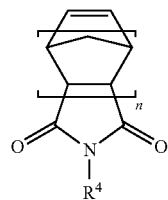

(2)

(In the above formula (2), $R^4$ indicates a hydrogen atom or alkyl group having 1 to 16 carbon atoms or aryl group. "n" indicates an integer of 1 to 2.)

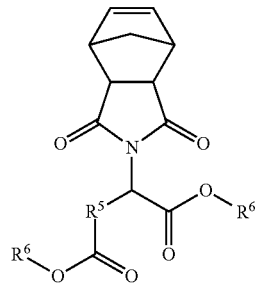

(3)

(In the above formula (3), $R^5$ indicates a bivalent alkylene group having 1 to 3 carbon atoms, while $R^6$ indicates a monovalent alkyl group having 1 to 10 carbon atoms or a monovalent halogenated alkyl group having 1 to 10 carbon atoms.)

In the above formula (2), $R^4$ is an alkyl group having 1 to 16 or aryl group. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, 1-methyltetradecyl group, and other branched alkyl groups; etc. may be mentioned. Further, as specific examples of the aryl group, a benzyl group etc. may be mentioned. Among these as well, due to the more excellent heat resistance and solubility in a polar solvent, an alkyl group having 6 to 14 carbon atoms and aryl group are preferable, while an alkyl group having 6 to 10 carbon atoms and aryl group are more preferable. If the number of carbon atoms is 4 or less, the solubility in a polar solvent is inferior, while if the number of carbon atoms is 17 or more, the heat resistance is inferior. Further, when patterning the resin film, there is the problem that the resin film melts by heat and the patterns to end up disappearing.

As specific examples of the monomer represented by the above formula (2), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2,3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3-propylhexyl)-bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

On the other hand, in the above formula (3), $R^5$ is a bivalent alkylene group having 1 to 3 carbon atoms. As the bivalent alkylene group having 1 to 3 carbon atoms, a methylene group, ethylene group, propylene group, and isopropylene group may be mentioned. Among these as well, due to the excellent polymerization activity, a methylene group and ethylene group are preferable.

Further, in the above formula (3), $R^6$ is a monovalent alkyl group having 1 to 10 carbon atoms or monovalent halogenated alkyl group having 1 to 10 carbon atoms. As the monovalent alkyl group having 1 to 10 carbon atoms, for example, a methyl group, ethyl group, propyl group, isopropyl group, butyl group, sec-butyl group, tert-butyl group, hexyl group, cyclohexyl group, etc. may be mentioned. As the monovalent halogenated alkyl group having 1 to 10 carbon atoms, for example, a fluoromethyl group, chloromethyl group, bromomethyl group, difluoromethyl group, dichloromethyl group, difluoromethyl group, trifluoromethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^6$, a methyl group or ethyl group is preferable.

Note that, the monomer represented by the above formulas (2) and (3) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonylbicyclo[2.2.1]

hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo[5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo[6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1]hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1]hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b1) may respectively be used alone or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$]pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methylidene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-vinyl-tetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, pentacyclo[9.2.1.1$^{3,9}$.0$^{2,10}$.0$^{4,8}$]pentadeca-5,12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{3,6}$.0$^{2,7}$]dodec-4-ene, tetracyclo[9.2.1.0$^{2,10}$.0$^{3,8}$]tetradec-3,5,7,12-tetraene, pentacyclo[9.2.1.1$^{3,9}$.0$^{2,10}$.0$^{4,8}$]pentadec-12-ene, etc. may be mentioned. These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable. These monomers (b3) may respectively be used alone or may be used as two types or more combined.

Among these monomers (b1) to (b3) as well, from the viewpoint of the effect of the present invention becoming more remarkable, a cyclic olefin monomer which has a polar group other than a protonic polar group (b1) is preferable, while a cyclic olefin which has an N-substituted imide group is particularly preferable.

In the cyclic olefin polymer (A1), the ratio of content of units of the copolymerizable monomer (b) is preferably 10 to 90 mol % with respect to the total monomer units. If the ratio of content of the units of the copolymerizable monomer (b) is too small, the cyclic olefin polymer (A1) is liable to become insufficient in solubility in a polar solvent, while if too great, heat resistance is liable to become insufficient.

Note that, in the present invention, it is also possible to introduce a protonic group in a cyclic olefin-based polymer which does not have a protonic polar group utilizing a known modifying agent so as to obtain the cyclic olefin polymer (A1). The polymer which does not have a protonic polar group can be obtained by polymerizing at least one of the above-mentioned monomers (b1) and (b2) and, in accordance with need, a monomer (b3) in any combination.

Further, the cyclic olefin polymer (A1) used in the present invention may be a ring-opened polymer obtained by ring-opening polymerization of the above-mentioned monomers or may be an addition polymer obtained by addition polymerization of the above-mentioned monomers, but from the viewpoint of the effect of the present invention becoming more remarkable, a ring-opened polymer is preferable.

A ring-opened polymer can be produced by ring-opening methathesis polymerization of a cyclic olefin monomer which has a protonic polar group (a) and a copolymerizable monomer (b) used according to need in the presence of a methathesis reaction catalyst. As the method of production, for example, the method described in International Publication No. 2010/110323A, [0039] to [0079], etc. can be used. On the other hand, an addition polymer can be obtained by causing polymerization of a cyclic olefin monomer which has a protonic polar group (a) and a copolymerizable monomer (b) used according to need using a known additional polymerization catalyst, for example, a catalyst comprised of a compound of titanium, zirconium, or vanadium and an organic aluminum compound.

Further, when the cyclic olefin polymer (A1) used in the present invention is a ring-opened polymer, it is preferable to further perform a hydrogenation reaction and obtain a hydrogenated product in which the carbon-carbon double bonds which are contained in the main chain are hydrogenated. When the cyclic olefin polymer (A1) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

Further, the acrylic resin (A2) used in the present invention is not particularly limited, but a homopolymer or copolymer having at least one of a carboxylic acid which has an acryl group, carboxylic anhydride which has an acryl group, epoxy group-containing acrylate compound and oxetane group-containing acrylate compound as an essential ingredient is preferable.

As specific examples of the carboxylic acid which has an acryl group, (meth)acrylic acid (meaning acrylic acid and/or methacrylic acid, below, same for methyl(meth)acrylate etc.), crotonic acid, maleic acid, fumaric acid, citraconic acid, mesaconic acid, glutaconic acid, phthalic acid mono-(2-((meth)acryloyloxy)ethyl), N-(carboxyphenyl)maleimide, N-(carboxyphenyl) (meth)acrylamide, etc. may be mentioned. As specific examples of the carboxylic anhydride which has an acryl group, maleic anhydride, citraconic anhydride, etc. may be mentioned.

As specific examples of the epoxy group-containing acrylate compound, glycidyl acrylate, glycidyl methacrylate, glycidyl α-ethyl acrylate, glycidyl α-n-propyl acrylate, glycidyl α-n-butyl acrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyacrylate, 3,4-epoxycyclohexylmethyl acrylate, 3,4-epoxycyclohexylmethyl methacrylate, etc. may be mentioned.

As specific examples of the oxetane group-containing acrylate compound, (3-methyloxetan-3-yl)methyl (meth) acrylate, (3-ethyloxetan-3-yl)methyl (meth)acrylate, (3-methyloxetan-3-yl)ethyl (meth)acrylate, (3-ethyloxetan-3-yl)ethyl (meth)acrylate, (3-chloromethyloxetan-3-yl) methyl (meth)acrylate, (oxetan-2-yl)methyl (meth)acrylate, (2-methyloxetan-2-yl)methyl (meth)acrylate, (2-ethyloxetan-2-yl)methyl (meth)acrylate, (1-methyl-1-oxetanyl-2-phenyl)-3-(meth)acrylate, (1-methyl-1-oxetanyl)-2-trifluoromethyl-3-(meth)acrylate, and (1-methyl-1-oxetanyl)-4-trifluoromethyl-2-(meth)acrylate, etc. may be mentioned. Among these as well, (meth)acrylic acid, maleic anhydride, glycidyl (meth)acrylate, 6,7-epoxyheptyl methacrylate, etc. are preferable.

The acrylic resin (A2) may also be a copolymer of at least one compound which is selected from unsaturated carboxylic acids, unsaturated carboxylic anhydrides, and epoxy group-containing unsaturated compounds, and other acrylate-based monomers or copolymerizable monomers other than acrylates.

As other acrylate-based monomers, methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, amyl (meth)acrylate, isoamyl (meth)acrylate, hexyl (meth)acrylate, heptyl (meth)acrylate, octyl (meth)acrylate, isooctyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, and other alkyl (meth)acrylates; hydroxyethyl (meth)acrylate, 2-hydroxypropyl (meth) acrylate, 3-hydroxypropyl (meth)acrylate, 2-hydroxybutyl (meth)acrylate, 3-hydroxybutyl (meth)acrylate, 4-hydroxybutyl (meth)acrylate, and other hydroxyalkyl (meth)acrylates; phenoxyethyl (meth)acrylate, 2-hydroxy-3-phenoxypropyl (meth)acrylate, and other phenoxyalkyl (meth) acrylates; 2-methoxyethyl (meth)acrylate, 2-ethoxyethyl (meth)acrylate, 2-propoxyethyl (meth)acrylate, 2-butoxyethyl (meth)acrylate, 2-methoxybutyl (meth)acrylate, and other alkoxyalkyl (meth)acrylates; polyethylene glycol mono(meth)acrylate, ethoxydiethylene glycol (meth)acrylate, methoxypolyethylene glycol (meth)acrylate, phenoxypolyethylene glycol (meth)acrylate, nonyl phenoxypolyethylene glycol (meth)acrylate, polypropylene glycol mono (meth)acrylate, methoxypolypropylene glycol (meth) acrylate, ethoxypolypropylene glycol (meth)acrylate, nonylphenoxypolypropylene glycol (meth)acrylate, and other polyalkylene glycol (meth)acrylates; cyclohexyl (meth)acrylate, 2-methylcyclohexyl (meth)acrylate, 4-butylcyclohexyl (meth)acrylate, 1-adamantyl (meth)acrylate, 2-methyl-2-adamantyl (meth)acrylate, 2-ethyl-2-adamantyl (meth)acrylate, tricyclo[5.2.1.0$^{2,6}$]decan-8-yl (meth)acrylate, tricyclo[5.2.1.0$^{2,6}$]-3-decen-8-yl (meth)acrylate, tricyclo[5.2.1.0$^{2,6}$]-3-decen-9-yl (meth)acrylate, bornyl (meth) acrylate, isobornyl (meth)acrylate, and other cycloalkyl (meth)acrylates; phenyl (meth)acrylate, naphthyl (meth) acrylate, biphenyl (meth)acrylate, benzyl (meth)acrylate, tetrahydrofurfuryl (meth)acrylate, 5-tetrahydrofurfuryl oxycarbonylpentyl (meth)acrylate, vinyl (meth)acrylate, allyl (meth)acrylate, 2-(2-vinyloxyethoxy)ethyl (meth)acrylate, 2-[tricyclo[5.2.1.0$^{2,6}$]decan-8-yloxy]ethyl (meth)acrylate, 2-[tricyclo[5.2.1.0$^{2,6}$]-3-decen-8-yloxy]ethyl (meth)acrylate, 2-[tricyclo[5.2.1.0$^{2,6}$]-3-decen-9-yloxy]ethyl (meth) acrylate, γ-butyrolactone (meth)acrylate, maleimide, N-methylmaleimide, N-ethylmaleimide, N-butylmaleimide, N-cyclohexylmaleimide, N-benzylmaleimide, N-phenylmaleimide, N-(2,6-diethylphenyl)maleimide, N-(4-acetylphenyl)maleimide, N-(4-hydroxyphenyl)maleimide, N-(4-acetoxyphenyl)maleimide, N-(4-dimethylamino-3,5-dinitrophenyl)maleimide, N-(1-anilinonaphthyl-4) maleimide, N-[4-(2-benzooxazolyl)phenyl]maleimide, N-(9-acridinyl)maleimide, etc. may be mentioned. Among these as well, methyl (meth)acrylate, butyl (meth)acrylate, cyclohexyl (meth)acrylate, 2-methylcyclohexyl (meth)acrylate, benzyl (meth)acrylate, tricyclo[5.2.1.0$^{2,6}$]decan-8-yl (meth)acrylate, N-phenylmaleimide, N-cyclohexylmaleimide, etc. are preferable.

The copolymerizable monomer other than acrylate is not particularly limited so long as a compound which can copolymerize with the above carboxylic acid which has an acryl group, carboxylic anhydride which has an acryl group, epoxy group-containing acrylate compound, but, for example, vinylbenzylmethyl ether, vinylglycidyl ether, styrene, α-methylstyrene, vinyltoluene, indene, vinylnaphthalene, vinylbiphenyl, chlorostyrene, bromostyrene, chloromethylstyrene, p-tert-butoxystyrene, p-hydroxystyrene, p-hydroxy-α-methylstyrene, p-acetoxystyrene, p-carboxystyrene, 4-hydroxyphenylvinylketone, acrylonitrile, methacrylonitrile, (meth)acrylamide, 1,2-epoxy-4-vinylcyclohexane, isobutene, norbornene, butadiene, isoprene, and other radical polymerizable compounds may be mentioned. These compounds may respectively be used alone or may be used as two types or more combined. The polymerization method of the above monomer may be an ordinary method. For example, the suspension polymerization method, the emulsion polymerization method, the solution polymerization method, etc. may be employed.

The Cardo resin (A3) used in the present invention is a resin which has a Cardo structure, that is, a skeletal structure with two cyclic structures bonded to a quaternary carbon atom which forms a cyclic structure. A general form of a Cardo structure is a structure in which benzene rings bond to a fluorene ring.

As specific examples of a skeletal structure where two cyclic structures are bonded to a quaternary carbon atom forming a cyclic structure, a fluorene skeleton, bisphenol fluorene skeleton, bisaminophenyl fluorene skeleton, fluorine skeleton having an epoxy group, fluorene skeleton having an acryl group, etc. may be mentioned.

The Cardo resin (A3) used in the present invention is formed by polymerization by reacting functional groups which bond to skeletons having Cardo structure each other. The Cardo resin (A3) has a structure where the main chain and bulky side chains are connected by a single element (Cardo structure) and has a cyclic structure in the direction substantially vertical to the main chain.

As one example of the Cardo structure, an example of a Cardo structure having an acrylate structure is shown in the following formula (4).

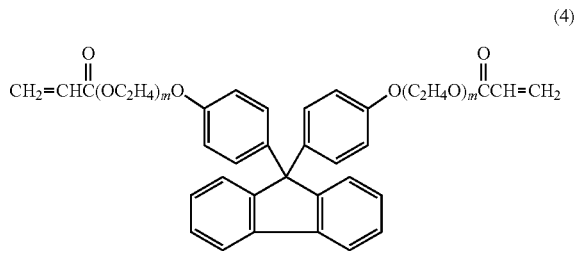

(4)

(In the above formula (4), "m" is an integer of 0 to 10.)

The monomer which has a Cardo structure is, for example, a bis(glycidyloxyphenyl)fluorene-type epoxy resin; a condensate of a bisphenolfluorene-type epoxy resin and acrylic acid; 9,9-bis(4-hydroxyphenyl)fluorene, 9,9-bis(4-hydroxy-3-methylphenyl)fluorene, or other Cardo structure-containing bisphenols; 9,9-bis(cyanomethyl) fluorene or other 9,9-bis(cyanoalkyl)fluorenes; 9,9-bis(3-aminopropyl)fluorene or other 9,9-bis(aminoalkyl)fluorenes; etc. may be mentioned.

The Cardo resin (A3) is a polymer which is obtained by polymerization of a monomer which has a Cardo structure, but may also be a copolymer with another copolymerizable monomer.

The polymerization method of the above monomers may be an ordinary method. For example, the ring-opening polymerization method or addition polymerization method etc. may be employed.

The polysiloxane (A4) used in the present invention is not particularly limited, but preferably a polymer which is obtained by mixing and reacting one or more types of organosilane represented by the following formula (5) may be mentioned.

(5)

In the above formula (5), $R^7$ is a hydrogen atom, alkyl group having 1 to 10 carbon atoms, alkenyl group having 2 to 10 carbon atoms, or aryl group having 6 to 15 carbon atoms. The plurality of $R^7$ may be the same or different. Note that, these alkyl groups, alkenyl groups, and aryl groups may all have substituents. Further, they may be nonsubstituted groups which do not have substituents and may be selected in accordance with the properties of the composition. As specific examples of the alkyl group, a methyl group, ethyl group, n-propyl group, isopropyl group, n-butyl group, t-butyl group, n-hexyl group, n-decyl group, trifluoromethyl group, 2,2,2-trifluoroethyl group, 3,3,3-trifluoropropyl group, 3-glycidoxypropyl group, 2-(3,4-epoxy cyclohexyl) ethyl group, 3-aminopropyl group, 3-mercaptopropyl group, and 3-isocyanatepropyl group may be mentioned. As specific examples of the alkenyl group, a vinyl group, 3-acryloxypropyl group, and 3-methacryloxypropyl group may be mentioned. As specific example of the aryl group, a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group, and naphthyl group may be mentioned.

Further, in the above formula (5), $R^8$ is a hydrogen atom, alkyl group having 1 to 6 carbon atoms, acyl group having 1 to 6 carbon atoms, or aryl group having 6 to 15 carbon atoms, where the plurality of $R^8$ may be the same or different. Note that, these alkyl groups and acyl groups may all have substituents. Further, they may be nonsubstituted groups which do not have substituents and may be selected in accordance with the properties of the composition. As specific examples of the alkyl group, a methyl group, ethyl group, n-propyl group, isopropyl group, and n-butyl group may be mentioned. As a specific example of the acyl group, an acetyl group may be mentioned. As a specific example of an aryl group, a phenyl group may be mentioned.

Furthermore, in the above formula (5), "p" is an integer of 0 to 3. When p=0, the compound becomes tetrafunctional silane, when p=1, it becomes trifunctional silane, when p=2, it becomes bifunctional silane, and when p=3, it becomes monofunctional silane.

As specific examples of an organosilane represented by the above formula (5), tetramethoxysilane, tetraethoxysilane, tetraacetoxysilane, tetraphenoxysilane, or other tetrafunctional silanes; methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 2-(3,4-epoxy cyclohexyl)ethyltrimethoxysilane, 3-mercaptopropyltrimethoxysilane, or other trifunctional silanes; dimethyldimethoxysilane, dimethyldiethoxysilane, dimethyldiacetoxysilane, di-n-butyldimethoxysilane, diphenyldimethoxysilane, or other bifunctional silanes; trimethylmethoxysilane, tri-n-butylethoxysilane, or other monofunctional silanes; may be mentioned.

Among these organosilanes, from the viewpoint of the crack resistance or hardness of the obtained resin film, trifunctional silanes are preferably used. These organosilanes may be used alone or may be used as two types or more combined.

The polysiloxane (A4) used in the present invention is obtained by the hydrolysis or partial condensation of the above-mentioned organosilanes. For the hydrolysis and partial condensation, general methods can be used. For example, a solvent, water, and according to need a catalyst are added to the mixture and heated and stirred. During stirring, in accordance with need, distillation may be used to distill off the hydrolysis byproducts (methanol or other alcohol) or condensation byproduct (water).

The polyimide (A5) used in the present invention can be obtained by heat treating a polyimide precursor obtained by reacting a tetracarboxylic anhydride and diamine. As the precursor for obtaining the polyimide, a polyamic acid, polyamic acid ester, polyisoimide, polyamic acid sulfonamide, etc. may be mentioned.

The polyimide (A5) used in the present invention is synthesized by a known method. That is, it is synthesized by a known method such as selectively combining tetracarboxylic dianhydride and a diamine and reacting these in N-methyl-2-pyrrolidone, N,N-dimethylacetoamide, N,N-dimethylformamide, dimethylsulfoxide, hexamethylphosphoric triamide, γ-butyrolactone, cyclopentanone, or other polar solvent.

When excessively using a diamine for polymerization, it is possible to make a carboxylic anhydride react with the end amino group of the produced polyimide (A5) so as to protect the end amino group. Further, when excessively using tetracarboxylic anhydride for polymerization, it is possible to make an amine compound react with the end acid anhydride group of the produced polyimide (A5) so as to protect the end acid anhydride group.

As examples of such carboxylic anhydrides, phthalic anhydride, trimellitic anhydride, maleic anhydride, naphthalic anhydride, hydrogenated phthalic anhydride, methyl-5-norbornene-2,3-dicarboxylic anhydride, itaconic anhydride, tetrahydrophthalic acid anhydride, etc. may be mentioned, while as examples of amine compounds, aniline, 2-hydroxyaniline, 3-hydroxyaniline, 4-hydroxyaniline, 2-ethynylaniline, 3-ethynylaniline, 4-ethynylaniline, etc. may be mentioned.

The binder resin (A) used in the present invention has a weight average molecular weight (Mw) of usually 1,000 to 1,000,000, preferably 1,500 to 100,000, more preferably 2,000 to 10,000 in range.

Further, the binder resin (A) has a molecular weight distribution of a weight average molecular weight/number average molecular weight (Mw/Mn) ratio of usually 4 or less, preferably 3 or less, more preferably 2.5 or less.

The weight average molecular weight (Mw) and molecular weight distribution (Mw/Mn) of the binder resin (A) are values which are found by gel permeation chromatography (GPC) using tetrahydrofuran and other solvents as eluents and as values converted to polystyrene.

(Radiation-Sensitive Compound (B))

The radiation-sensitive compound (B) used in the present invention is not particularly limited so long as a compound able to undergo a chemical reaction by irradiation by radiant energy such as ultraviolet light or an electron beam, but one enabling control of the alkali solubility of the resin film formed using the resin composition is preferable. As the radiation-sensitive compound (B), a photoacid generator is particularly preferably used.

As the photoacid generator, for example, an acetophenone compound, triaryl sulfonium salt, an azide compound such as a quinone diazide compound etc. may be mentioned, but an azide compound is preferable and a quinone diazide compound is more preferable.

As the quinone diazide compound, for example, an ester compound of a quinone diazide sulfonic acid halide and a compound having a phenolic hydroxyl group can be used. As specific examples of the quinine diazide sulfonic acid halide, 1,2-naphthoquinonediazide-5-sulfonic acid chloride, 1,2-naphthoquinonediazide-4-sulfonic acid chloride, 1,2-benzoquinonediazide-5-sulfonic acid chloride, etc. may be mentioned. As typical examples of a compound having a phenolic hydroxyl group, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, etc. may be mentioned. As other compounds having a phenolic hydroxyl group, 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl)ethane, 1,1,2,2-tetrakis(4-hydroxyphenyl)ethane, an oligomer of a novolac resin, an oligomer obtained by copolymerization of a compound having one or more phenolic hydroxyl groups and dicyclopentadiene etc. may be mentioned. Among these as well, a condensate of 1,2-naphthoquinone diazide-5-sulfonic acid chloride and a compound having a phenolic hydroxyl group is preferable, while a condensate of 1,1,3-tris(2,5-dimethyl-4-hydroxyphenyl)-3-phenylpropane and 1,2-naphthoquinone diazide-5-sulfonic acid chloride is more preferable.

Further, as a photoacid generator, in addition to the above-mentioned quinone diazide compound, a known one such as an onium salt, halogenated organic compound, α,α'-bis(sulfonyl)diazomethane-based compound, α-carbonyl-α'-sulfonyl diazomethane-based compound, sulfone compound, organic acid ester compound, organic acid amide compound, and organic acid imide compound can be used.

The radiation-sensitive compound (B) can be used as a single type alone or as two types of compounds or more combined. Among these as well, a quinone diazide compound is preferable since a positive type radiation-sensitive resin compound can be prepared.

In the radiation-sensitive resin composition of the present invention, the content of the radiation-sensitive compound (B) is preferably 1 to 100 parts by weight with respect to 100 parts by weight of the binder resin (A), more preferably 5 to 50 parts by weight, still more preferably 10 to 40 parts by weight in range. If the amount of use of the radiation-sensitive compound (B) is in this range, when patterning a resin film comprised of the radiation-sensitive resin composition of the present invention formed on any board, the difference in solubility of parts irradiated by radiant energy and parts not irradiated by radiant energy in the development solution becomes greater, patterning by development becomes easy, and the radiation sensitivity becomes higher, so this is preferable.

(Cross-Linking Agent (C) Represented by General Formula (1))

The radiation-sensitive resin composition of the present invention comprises, in addition to the above-mentioned binder resin (A) and radiation-sensitive compound (B), a cross-linking agent (C) represented by the following general formula (1).

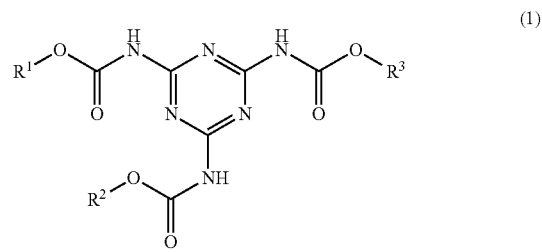

(In the general formula (1), each of $R^1$ to $R^3$ independently represents a hydrocarbon group having 1 to 10 carbon atoms.)

In the present invention, the cross-linking agent (C) represented by the above general formula (1) is a compound having a triazine ring structure and urethane bond. By mixing in such a cross-linking agent (C) represented by the general formula (1) (below, suitably called the "cross-linking agent (C)") in the later explained specific amount, the resin film obtained using the radiation-sensitive resin composition of the present invention can be made one which is high in exposure sensitivity, low in coefficient of water absorption, and excellent in patternability by development while the UV ozone treatment resistance is improved.

In the above general formula (1), each of $R^1$ to $R^3$ independently represents a hydrocarbon group having 1 to 10 carbon atoms, preferably a hydrocarbon group having 1 to 8 carbon atoms, more preferably a hydrocarbon group having 1 to 6 carbon atoms. Further, when one having 3 or more carbon atoms, $R^1$ to $R^3$ may be any of linear or branched alkyl group, alkylene group, group having an alicyclic structure, and group having aromatic ring, but linear alkyl group is preferable. As specific examples of $R^1$ to $R^3$, a methyl group, ethyl group, propyl group, butyl group, pentyl group, hexyl group, cyclobutyl group, cyclopentyl group, cyclohexyl group, aryl group, etc. may be mentioned, but from the viewpoint of the greater effect of improvement of the UV ozone treatment resistance, a methyl group and/or n-butyl group are preferable. The cross-linking agent (C) may be used as a single type alone or as two types of compounds or more combined.

The cross-linking agent (C) used in the present invention, for example, can be synthesized by a known method such as a method using triazine and a cyclic carbonate, but, for example, a commercially available one such as product name "Cymel NF2000" (made by Daicel-Allnex) may be used.

In the radiation-sensitive resin composition of the present invention, the content of the cross-linking agent (C) is 3 to 25 parts by weight with respect to 100 parts by weight of the binder resin (A), preferably 7 to 25 parts by weight, more preferably 10 to 25 parts by weight. If the content of the cross-linking agent (C) is too small, the effect of improvement of the UV ozone treatment resistance can no longer be obtained, while if too great, the patternability by development ends up remarkably declining.

(Cross-Linking Agent (D) Having Triazine Ring Structure or Glycoluril Structure and Having at Least One Type of Functional Group Consisting of Methylol Group and Alkoxyalkyl Group)

Further, the radiation-sensitive resin composition of the present invention preferably contains, in addition to the above ingredients, a cross-linking agent (D) having a triazine ring structure or glycoluril structure and having one or more types of functional groups selected from a group consisting of a methylol group and alkoxyalkyl group (below, suitably called a "cross-linking agent (D)"). By further containing the cross-linking agent (D), the obtained resin film can be made one lower in coefficient of water absorption and more excellent in UV ozone treatment resistance. Note that among alkoxyalkyl groups as well, an alkoxybutyl group such as a methoxybutyl group and ethoxybutyl group or a methoxymethyl group is preferable. Further, the obtained resin film preferably contains not only an alkoxyalkyl group, but also a methylol group from the viewpoint of a good balance of a high exposure sensitivity, suppression of development residue, low amount of water absorption, UV ozone treatment resistance, and other such characteristics.

The cross-linking agent (D) is one having a triazine ring structure or glycoluril structure, but from the viewpoint of enabling the effect of addition to be made more remarkable, a compound having a melamine structure represented by the following general formula (6) or a compound having a guanamine structure represented by the following general formula (7) is preferable, while a compound having a melamine structure is more preferable.

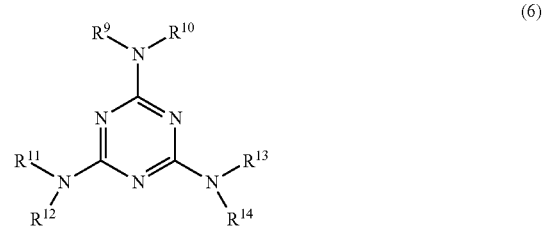

(6)

(In the general formula (6), each of $R^9$ to $R^{14}$ independently represents a hydrogen atom, substituted or unsubstituted alkyl group, substituted or unsubstituted aryl group, methylol group, or alkoxyalkyl group, among $R^9$ to $R^{14}$, at least one being a methylol group or alkoxyalkyl group.)

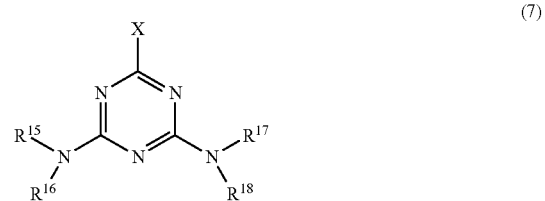

(7)

(In the general formula (7), each of $R^{15}$ to $R^{18}$ independently represents a hydrogen atom, substituted or unsubstituted alkyl group, substituted or unsubstituted aryl group, methylol group, or alkoxyalkyl group, among $R^{15}$ to $R^{18}$, at least one being a methylol group or alkoxyalkyl group. X is a hydrogen atom, substituted or unsubstituted alkyl group, or substituted or unsubstituted aryl group.)

Note that, the compound having the melamine structure represented by the general formula (6) can, for example, be obtained by making acetoaldehyde and a corresponding alcohol react with melamine. A compound having a guanamine structure represented by the above general formula (7) can also be obtained by a similar method. For this reason, the compound having the melamine structure represented by the general formula (6) and the compound having a guanamine structure represented by the above general formula (7) sometimes are obtained not as single compounds, but as a mixture. For example, they may become a mixture of compounds having different polynuclear complexes or a mixture of compounds having different numbers of functional groups. Further, in the case of a mixture of compounds having different polynuclear complexes, for example, it is possible to confirm the polynuclear average of a mixture by the average polymerization degree.

Further, the cross-linking agent (D) used in the present invention has a functional group comprised of a methylol group or alkoxyalkyl group. The methylol group or alkoxyalkyl group is preferably contained in an average of one or more groups per one triazine ring or per one glycoluril structure, more preferably an average of two to six groups per one triazine ring or per one glycoluril structure. Note that, the number of the methylol groups or alkoxyalkyl groups, as described for example in the New Edition Polymer Analysis Handbook (issued by Kinokuniya Shoten, first edition first printing Jan. 12, 1995), can be measured by dissolving the cross-linking agent (D) in dimethylsulfoxide-$d_6$ (DMSO-$d_6$) and using the proton nuclear magnetic resonance spectrum ($^1$H NMR) or the carbon nuclear magnetic resonance spectrum ($^{13}C$ NMR) to determine the amount from the proton peaks or carbon peaks of the desired functional group.

Furthermore, the cross-linking agent (D) used in the present invention, for example, may be a monomer such as the compound having the melamine structure represented by the general formula (6) and the compound having a guanamine structure represented by the above general formula (7) or may be a polymer obtained by polymerization of these. In that case, the average polymerization degree is preferably 1.3 to 4.0, more preferably 1.8 to 3.5, still more preferably 2.0 to 3.0.

Further, as the cross-linking agent (D), for example, it is possible to use ones commercially available from different companies. The following ones may be illustrated. Note that below, the figures in parentheses show the average polymerization degrees. Further, below, the "monomer concentration" is the ratio, in the composition, of the compound represented by the general formula (6) or general formula (7) present as is as a monomer.

That is, as the cross-linking agent (D) having a triazine ring structure and having one or more types of functional groups selected from the group consisting of a methylol group and alkoxyalkyl group, "Cymel 370" (2.60), "Cymel 771" (2.20), "Cymel 272" (2.50), "Cymel 701" (1.80), "Cymel 266" (1.40), "Cymel 267" (1.50), "Cymel 285" (1.50), "Cymel 232" (1.50), "Cymel 235" (1.40), "Cymel 212" (1.60), "Cymel 253" (1.90), "Cymel 254" (2.30), "Cymel 236" (1.40), "Cymel 238" (1.60), "Cymel 272" (2.50), "Cymel 202" (2.10), "Cymel 207" (2.10), "Mycoat 102" (1.32), "Mycoat 506" (2.20), "Mycoat 508" (2.60), "Cymel 1128" (3.00), "Mycoat 130" (1.77) (above, made by Cytex Industries), "Nikalac MW-100LM" (monomer concentration about 75%), "Nikalac MX-750" (2.20), "Nikalac MX-750LM" (monomer concentration about 40%), "Nikalac MX-706" (2.60) (above, made by Sanwa Chemical), etc. may be illustrated.

Further, as the cross-linking agent (D) having a glycoluril structure and having one or more types of functional groups selected from a group comprising a methylol group and alkoxyalkyl group, "Cymel 1170" (1.50), "Cymel 1172" (2.00) (above, made by Cytex Industries), etc. may be illustrated.

Further, the cross-linking agent (D) used in the present invention is preferably one with a small amount of metal. As the method for lowering the amount of metal in the cross-linking agent (D), for example, the method using treatment for lowering the metal (below, sometimes abbreviated as "metal lowering treatment") etc. may be mentioned. As the method of the metal lowering treatment, the method using filtration using a filter such as a zeta filter, the method of using a metal lowering treatment agent, etc. may be mentioned.

In the radiation-sensitive resin composition of the present invention, the content of the cross-linking agent (D) is preferably 10 to 100 parts by weight with respect to 100 parts by weight of the binder resin (A), more preferably 15 to 45 parts by weight, still more preferably 20 to 40 parts by weight. By making the amount of the cross-linking agent (D) the above range, the effects of addition of the cross-linking agent (D), that is, the effect of decreasing the coefficient of water absorption and the effect of improvement of the UV ozone treatment resistance, can be enhanced more.

(Epoxy Compound (E))

Further, the radiation-sensitive resin composition of the present invention preferably further contains, in addition to the above ingredients, an epoxy compound (E). By further including the epoxy compound (E), the obtained resin film can be made further better in patternability by development and UV ozone treatment resistance. The epoxy compound (E) is not particularly limited so long as a compound having an epoxy group.

As specific examples of the epoxy compound (E), an epoxy compound having an alicyclic structure such as a trifunctional epoxy compound having dicyclopentadiene as a backbone (product name "XD-1000", made by Nippon Kayaku), a 1,2-epoxy-4-(2-oxiranyl)cyclohexane adduct of 2,2-bis(hydroxymethyl)1-butanol (15-functional alicyclic epoxy resin having cyclohexane backbone and end epoxy group, product name "EHPE3150", made by Daicel Chemical Industry), epoxylated 3-cyclohexene-1,2-dicarboxylic acid bis(3-cyclohexenylmethyl)-modified ε-caprolactone (aliphatic cyclic trifunctional epoxy resin, product name "Epolide GT301", made by Daicel Chemical Industry), and an epoxylated butane tetracarboxylic acid tetrakis(3-cyclohexenylmethyl)-modified ε-caprolactone (aliphatic cyclic tetrafunctional epoxy resin, product name "Epolide GT401", made by Daicel Chemical Industry);

an epoxy compound not having an alicyclic structure such as an aromatic amine type polyfunctional epoxy compound (product name "H-434", made by Tohto Chemical Industry), cresol novolac type polyfunctional epoxy compound (product name "EOCN-1020", made by Nippon Kayaku), phenol novolac type polyfunctional epoxy compound (Epicoat 152, 154, made by Japan Epoxy Resins), polyfunctional epoxy compound having a naphthalene backbone (product name EXA-4700, made by DIC), chain alkyl polyfunctional epoxy compound (product name "SR-TMP", made by Sakamoto Yakuhin Kogyo), polyfunctional epoxy polybutadiene (product name "Epolide PB3600", made by Daicel Chemical Industry), glycidyl polyether compound of glycerin (product name "SR-GLG", made by Sakamoto Yakuhin Kogyo), diglycerin polyglycidyl ether compound (product name "SR-DGE", made by Sakamoto Yakuhin Kogyo), and polyglycerin polyglycidyl ether compound (product name "SR-4GL", made by Sakamoto Yakuhin Kogyo) may be mentioned.

In the radiation-sensitive resin composition of the present invention, the content of the epoxy compound (E) is preferably 3 to 70 parts by weight with respect to 100 parts by weight of the binder resin (A), more preferably 4 to 45 parts by weight, still more preferably 5 to 25 parts by weight. By making the amount of the epoxy compound (E) the above range, the effect of addition of the epoxy compound (E), that is, the effect of improvement of the patternability by development and UV ozone treatment resistance can be enhanced more.

(Other Compounding Agents)

The radiation-sensitive resin composition of the present invention may further contain a solvent. The solvent is not particularly limited, but one known as a solvent of a resin composition, for example, acetone, methylethylketone, cyclopentanone, 2-hexanone, 3-hexanone, 2-heptanone, 3-heptanone, 4-heptanone, 2-octanone, 3-octanone, 4-octanone, or other straight chain ketones; n-propyl alcohol, isopropyl alcohol, n-butyl alcohol, cyclohexanol, or other alcohols; ethyleneglycol dimethyl ether, ethyleneglycol diethyl ether, dioxane, or other ethers; ethyleneglycol monomethyl ether, ethyleneglycol monoethyl ether, or other alcohol ethers; propyl formate, butyl formate, propyl acetate, butyl acetate, methyl propionate, ethyl propionate, methyl butyrate, ethyl butyrate, methyl lactate, ethyl lactate, or other esters; cellosolve acetate, methylcellosolve acetate, ethylcellosolve acetate, propylcellosolve acetate, butylcellosolve acetate, or other cellosolve esters; propyleneglycol, propyleneglycol monomethyl ether, propylene glycol monomethyl ether acetate, propylene glycol monoethyl ether acetate, propylene glycol monobutyl ether, or other propylene glycols; diethylene glycol monomethyl ether, diethylene glycol monoethyl ether, diethylene glycol dimethyl ether, diethylene glycol diethyl ether, diethylene glycol methylethyl ether, or other diethylene glycols; γ-butyrolactone, γ-valerolactone, γ-caprolactone, γ-caprylolactone, or other saturated γ-lactones; trichloroethylene or other halogenated hydrocarbons; toluene, xylene, or other aromatic hydrocarbons; dimethylacetoamide, dimethylformamide, N-methylacetoamide, or other polar solvents; etc. may be mentioned. These solvents may be used alone or as two types or more combined. The content of the solvent is preferably 10 to 10000 parts by weight with respect to 100 parts by weight of the binder resin (A), more preferably 50 to 5000 parts by weight, furthermore preferably 100 to 1000 parts by weight in range. Note that, when the radiation-sensitive resin composition of the present invention is made to include a solvent, the solvent is normally removed after forming the resin film.

Further, the radiation-sensitive resin composition of the present invention may contain as desired, if a range in which the effects of the present invention are not impaired, another compounding agent such as a surfactant, acidic compound, coupling agent or its derivative, sensitizer, latent acid generator, antioxidant, photostabilier, defoamer, pigment, dye, and filler.

The surfactant is used to prevent striation, improve the development property, and for other purposes. As specific examples of the surfactant, polyoxyethylene lauryl ether, polyoxyethylene stearyl ether, polyoxyethylene oleyl ether, and other polyoxyethylene alkyl ethers; polyoxyethylene octylphenyl ether, polyoxyethylene nonyl phenyl ether, and other polyoxyethylene aryl ethers; polyoxyethylene dilaurate, polyoxyethylene distearate, and other polyoxyethylene dialkyl esters, and other nonion-based surfactants; fluorine-based surfactants; silicone-based surfactants; methacrylic acid copolymer-based surfactants; acrylic acid copolymer-based surfactants; etc. may be mentioned.

The coupling agent or its derivative has the effect of better improving the adhesion between a resin film comprised of the radiation-sensitive resin composition and the layers forming the semiconductor device board including the semiconductor layers. As the coupling agent or its derivative, a compound having one atom selected from a silicon atom, titanium atom, aluminum atom, and zirconium atom and having a hydrocarbyloxy group or hydroxy group bonding with that atom can be used.

As the coupling agent or its derivative, for example, tetraalkoxysilanes such as tetramethoxysilane, tetraethoxysilane, tetra-n-propoxysilane, tetra-i-propoxysilane, and tetra-n-butoxysilane, trialkoxysilanes such as methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, n-decyltrimethoxysilane, p-styryltrimethoxysilane, vinyltrimethoxysilane, vinyltriethoxysilane, cyclohexylsilyltrimethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, N-2-(aminoethyl)-3-aminopropyltrimethoxysilane, N-phenyl-3-aminopropyltrimethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-(meth)acryloxypropyltrimethoxysilane, 3-(meth)acryloxypropyltriethoxysilane, 3-ureidopropyltrimethoxysilane, 3-ureidopropyltriethoxysilane, 3-ethyl(trimethoxysilylpropoxymethyl)oxetane, 3-ethyl(triethoxysilylpropoxymethyl)oxetane, 3-triethoxysilyl-N-(1,3-dimethyl-butylidene)propylamine, and bis(triethoxysilylpropyl)tetrasulfide, dialkoxysilanes such as dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, di-n-butyldimethoxysilane, di-n-pentyldimethoxysilane, di-n-pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxysilane, diphenyldiethoxysilane, 3-glycidoxypropylmethyldiethoxysilane, 3-methacryloxypropylmethyldimethoxysilane, 3-acryloxypropylmethyldimethoxysilane, 3-methacryloxypropylmethyldiethoxysilane, 3-acryloxypropylmethyldiethoxysilane, and N-2-(aminoethyl)-3-aminopropylmethyldimethoxysilane and also silicon atom-containing compounds such as methyltriacetyloxysilane and dimethyldiacetyloxysilane;

titanium atom-containing compounds such as tetra-i-propoxytitanium, tetra-n-butoxytitanium, tetrakis(2-ethylhexyloxy)titanium, titanium-i-propoxyoctylene glycolate, di-i-propoxy-bis(acetylacetonate)titanium, propanedioxytitanium bis(ethylacetoacetate), tri-n-butoxytitanium monostearate, di-i-propoxytitanium distearate, titanium stearate, di-i-propoxytitanium diisostearate, (2-n-butoxycarbonylbenzoyloxy)tributoxytitanium, and di-n-butoxy-bis(triethanolaluminate)titanium, plus the Plenact series (made by Ajinomoto Fine-Techno);

aluminum atom-containing compounds such as acetoalkoxyaluminum diisopropylate;

zirconium atom-containing compounds such as tetra-n-propoxyzirconium, tetra-n-butoxyzirconium, zirconium tetraacetyl acetonate, zirconium tributoxyacetyl acetonate, zirconium monobutoxyacetyl acetonate bis(ethyl acetoacetate), zirconium dibutoxy bis(ethyl acetoacetate), zirconium tetraacetyl acetonate, and zirconium tributoxystearate; may be mentioned.

As specific examples of the sensitizer, 2H-pyrido-(3,2-b)-1,4-oxazin-3(4H)-ones, 10H-pyrido(3,2-b)-1,4-benzothiadines, urazoles, hydantoins, barbituric acids, glycine anhydrides, 1-hydroxybenzotriazoles, alloxans, maleimides, etc. may be mentioned.

As the antioxidant, a phenol-based antioxidant, phosphorus-based antioxidant, sulfur-based antioxidant, lactone-based antioxidant, etc. used for a usual polymer can be used. For example, as phenols, 2,6-di-t-butyl-4-methylphenol, p-methoxyphenol, styrenated phenol, n-octadecyl-3-(3',5'-di-t-butyl-4'-hydroxyphenyl)propionate, 2,2'-methylene-bis (4-methyl-6-t-butylphenol), 2-t-butyl-6-(3'-t-butyl-5'-methyl-2'-hydroxybenzyl)-4-methylphenylacrylate, 4,4'-butylidene-bis-(3-methyl-6-t-butylphenol), 4,4'-thio-bis(3-methyl-6-t-butylphenol), pentaerythritol tetrakis[3-(3,5-di-t-butyl-4-hydroxyphenyl)propionate], alkylated bisphenol, etc. may be mentioned. As the phosphorus-based antioxidants, triphenyl phosphite and tris(nonylphenyl) phosphite may be mentioned, while as the sulfur-based ones, dilauryl thiodipropionate etc. may be mentioned.

As the photostabilier, benzophenone-based, salicyclic acid ester-based, benzotriazole-based, cyanoacrylate-based, metal complex-based, and other ultraviolet ray absorbers, hindered amine-based light stabilizers (HALS) and other stabilizers which trap radicals generated due to light may be used. Among these as well, a HALS is a compound which has a piperidine structure and is preferable since it causes little coloring with respect to a radiation-sensitive resin composition and is good in stability. As specific compounds, bis(2,2,6,6-tetramethyl-4-piperidyl)sebacate, 1,2,2,6,6-pentamethyl-4-piperidyl/tridecyl-1,2,3,4-butanetetracarboxylate, bis(1-octyloxy-2,2,6,6-tetramethyl-4-piperidyl)sebacate, etc. may be mentioned.

The method of preparation of the radiation-sensitive resin composition of the present invention is not particularly limited, but the ingredients forming the radiation-sensitive resin composition may be mixed by a known method.

The method of mixing is not particularly limited, but it is preferable to dissolve or disperse the components which form the radiation-sensitive resin composition in solvents and mix the solutions or dispersions. Due to this, the radiation-sensitive resin composition is obtained in the form of a solution or dispersion.

The method of dissolving or dispersing the components which form the radiation-sensitive resin composition in solvents may be an ordinary method. Specifically, this may be performed by stirring using a stirring bar and magnetic stirrer, high speed homogenizer, disperser, planetary stirrer, twin-screw stirrer, ball mill, triple roll, etc. Further, the ingredients may also be dissolved or dispersed in a solvent, then for example filtered using a filter with a pore size of 0.5 μm or so etc.

The solid content concentration of the radiation-sensitive resin composition of the present invention is usually 1 to 70 wt %, preferably 5 to 60 wt %, more preferably 10 to 50 wt %. If the solid content concentration is in this range, stability of dissolution, coatability, uniformity of thickness and flatness of the resin film which is formed, etc. are obtained in a high balance.

Further, in the radiation-sensitive resin composition of the present invention, the ratios of content of Na, Mg, Al, K, Ca, Cr, Mn, Fe, and Ni is preferably a weight ratio with respect to the total radiation-sensitive resin composition of preferably less than 500 ppb, more preferably less than 200 ppb, particularly preferably less than 100 ppb.

(Resin Film)

The resin film of the present invention can be obtained using the above-mentioned radiation-sensitive resin composition of the present invention. The radiation-sensitive resin film of the present invention is preferably obtained by the above-mentioned resin composition of the present invention being formed on the substrate.

As the substrate, for example, a printed circuit board, silicon wafer substrate, soda glass or other glass substrate, polyethylene naphthalate or other plastic substrate, etc. may be used. Among these as well, a soda glass substrate used for a display device provided with a touch panel structure or a polyethylene naphthalate substrate is preferably used.

The method of forming the resin film is not particularly limited, but for example the coating method, film lamination method, or other method can be used.

The coating method is, for example, the method of coating a radiation-sensitive resin composition, then drying by heating to remove the solvent. As the method of coating the radiation-sensitive resin composition, for example, the spray method, spin coat method, roll coat method, die coat method, doctor blade method, spin coat method, bar coat method, screen print method, and other various methods can be employed. The heating and drying conditions differ according to the type and ratio of the ingredients, but are usually 30 to 150° C., preferably 60 to 120° C. usually for 0.5 to 90 minutes, preferably 1 to 60 minutes, more preferably 1 to 30 minutes.

The film lamination method is a method comprising coating a radiation-sensitive resin composition on a resin film, metal film or other substrate for forming B-stage film, then heating and drying it to remove the solvent to obtain the B-stage film, then laminating this B-stage film. The heating and drying conditions may be suitably selected in accordance with the types and ratios of content of the ingredients, but the heating temperature is usually 30 to 150° C. and the heating time is usually 0.5 to 90 minutes. The film lamination may be performed by using a press laminator, press, vacuum laminator, vacuum press, roll laminator, and other press bonding machines.

The thickness of the resin film is not particularly limited, but may be suitably set in accordance with the application, but when the resin film is a protective film or insulating film of, for example, a touch panel structure of a display device provided with a touch panel structure, the thickness of the resin film is preferably 0.1 to 100 μm, more preferably 0.5 to 50 μm, furthermore preferably 0.5 to 30 μm.

Further, since the radiation-sensitive resin composition of the present invention contains at least the cross-linking agent (C) represented by the general formula (1), the resin film which is formed by the above-mentioned coating method or film lamination method can be cross-linked. This cross-linking may be performed by selecting a suitable method in accordance with the type of the cross-linking agent (C), but usually is performed by heating. The heating method, for example, may be one using a hot plate, oven, etc. The heating temperature is usually 180 to 250° C. The heating time is suitably selected in accordance with the area or thickness of the resin film, the equipment which is used, etc. For example, when using a hot plate, it is normally 5 to 60 minutes, while when using an oven, it is normally 30 to 90 minutes. The heating may be performed in accordance with need in an inert gas atmosphere. The inert gas may be one which does not contain oxygen and which does not oxidize a resin film. For example, nitrogen, argon, helium, neon, xenon, krypton, etc. may be mentioned. Among these as well, nitrogen and argon are preferable. In particular, nitrogen is preferable. In particular, inert gas with an oxygen content of 0.1 vol % or less, preferably 0.01 vol % or less, in particular nitrogen, is suitable. These inert gases may be respectively used alone or as two types or more combined.

Further, since the radiation-sensitive resin composition of the present invention contains the radiation-sensitive compound (B), the resin film which is formed using the resin composition can be patterned if necessary. As the method of patterning a resin film, for example, the method of forming a resin film before patterning, irradiating active radiation at the resin film before patterning to form latent patterns, then bringing the resin film which has the latent patterns into contact with the developing solution to bring out the patterns etc. may be mentioned.

The active radiation is not particularly limited so long as able to activate radiation-sensitive compound (B) contained in the radiation-sensitive resin composition and change the alkali solubility of the radiation-sensitive resin composition containing the radiation-sensitive compound. Specifically, ultraviolet light, g-rays or i-rays and other single wavelength ultraviolet light, KrF excimer laser light, ArF excimer laser light, and other light beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-rays, i-rays, KrF excimer laser light, ArF excimer laser light, and other light beams through a desired mask pattern or the method of using an electron beam or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 1,000 $mJ/cm^2$, preferably 50 to 500 $mJ/cm^2$ in range and is determined in accordance with the irradiation time and illuminance. After irradiating the active radiation in this way, in accordance with need, the resin film is heat treated at 60 to 130° C. or so in temperature for 1 to 2 minutes or so.

Next, the latent patterns which are formed in the resin film before patterning are developed to bring them out. As the developing solution, normally aqueous solutions of alkali compounds may be used. As alkali compounds, for example, alkali metal salts, amines, and armnonium salts may be used. The alkaline compounds may be inorganic compounds or organic compounds. As specific examples of these compounds, sodium hydroxide, potassium hydroxide, sodium carbonate, sodium silicate, metasodium silicate, and other alkali metal salts; ammonia water; ethylamine, n-propylamine, and other primary amines; diethylamine, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrol, piperidine, 1,8-diazabicyclo[5.4.0]undec-7-ene, 1,5-diazabicyclo[4.3.0]non-5-ene, N-methylpyrrolidone, and other cyclic amines; etc. may be mentioned. These alkali compounds may be respectively used alone or as two types or more combined.

As the aqueous medium which is used as the alkali aqueous solution, water; methanol, ethanol, and other water soluble organic solvents may be used. The alkali aqueous solution may have a surfactant etc. added in a suitable amount.

As the method for bringing the developing solution in contact with the resin film which has the latent patterns, for example, the puddle method, spray method, dipping method, and other methods may be used. The development conditions are suitably selected as normally 0 to 100° C., preferably 5 to 55° C., more preferably 10 to 30° C. and normally 30 to 180 seconds.

The resin film which is formed with the targeted patterns in this way, for example, may be washed by UV ozone treatment or may be rinsed by a rinse solution so as to remove development residue.

In the present invention, the resin film may be crosslinked after patterning. The cross-linking can be performed by the above-mentioned method.

(Electronic Device)

The electronic device of the present invention is provided with a resin film of the present invention. The electronic device of the present invention is not particularly limited. Various electronic devices may be mentioned. Preferably, an organic EL device may be mentioned. The resin film of the present invention can be particularly suitably used for applications of such pixel separation films of organic EL devices (also called "pixel defining films" and "device separation films"). That is, the pixel separation film of an organic EL device, in its process of formation, is formed by developing the resin film to pattern it and by washing it using UV ozone treatment after patterning by development, so not only a low coefficient of water absorption but also excellent patternability after development and UV ozone treatment resistance (suppressed deterioration after UV ozone treatment) are sought. In contrast, the resin film of the present invention is obtained by using the above-mentioned radiation-sensitive resin composition of the present invention. For this reason, it is high in exposure sensitivity, low in coefficient of water absorption, and excellent in patternability by development and UV ozone treatment resistance, so can be suitably used for applications as a pixel separation film for an organic EL device.

Note that the resin film obtained using the radiation-sensitive resin composition of the present invention can be suitably used for applications as a pixel separation film for an organic EL device in this way, but of course can also be used for applications other than a pixel separation film for an organic EL device.

EXAMPLES

Below, examples and comparative examples will be given to explain the present invention more specifically. In the examples, "parts" are based on weight unless otherwise indicated.

Note that the definitions of the characteristics and the method of evaluation are as follows.

<Exposure Sensitivity>

A glass board on which ITO was spattered was coated by a radiation-sensitive resin composition by spin coating. A hot plate was used to heat and dry this at 110° C. for 2 minutes (prebake it) to form a thickness 2.2 μm resin film. Next, for patterning the resin film, an exposure process was performed by using a mask able to form 25 μm contact holes and changing the amount of exposure from 50 $mJ/cm^2$ to 350 $mJ/cm^2$. In the exposure process, a high pressure mercury lamp emitting light of the wavelength of g-rays (436 nm), h-rays (405 nm), and i-rays (365 nm) was used. Next, a 2.38 wt % tetramethyl ammonium hydroxide aqueous solution was used to adjust the time for development at 25° C. so that the film thickness became 1.7 μm, then ultrapure water was used to rinse the board for 30 seconds to thereby obtain a multilayer board comprised of a resin film having contact holes and a glass board.

Further, an optical microscope was used to examine the contact hole parts of the obtained multilayer board and measure the lengths of the contact hole sizes of the resin film at parts exposed by different amounts of exposure. Further, an approximation curve was prepared from the relationship between the amounts of exposure and the contact hole sizes of the resin film formed at the corresponding amounts of exposure, the amount of exposure when a contact hole becomes 25 μm was calculated, and that amount of exposure was calculated as the exposure sensitivity. The lower the amount of exposure when a contact hole becomes 25 μm, the lower the energy or the shorter the time by which patterns can be formed, so the more preferable.

<Pattern Formability by Development (Development Residue)>

The same procedure was followed as the above-mentioned exposure sensitivity evaluation to prepare a multilayer board. After that, an XPS (made by ULVAC PHI, "PHI5000 VersaProbe II") was used to analyze the elements at the inside of a contact hole when making the diameter of the X-ray 10 μm. The elements analyzed were the four elements of carbon, indium, tin, and oxygen. From the results of elementary analysis, the ratio of indium and tin (unit: %) was calculated. The higher the total of the ratios of elements of indium and tin, the smaller the amount of residue that can remain in the contact holes and therefore the better the patternability by development.

<Coefficient of Water Absorption and UV Ozone Treatment Resistance>

A silicon wafer board was coated with the radiation-sensitive resin composition by the spin coat method, then a hot plate was used to heat and dry this (prebake it) at 110° C. for 2 minutes to form a thickness 1.7 μm resin film. Next, the entire film surface was exposed at 1000 mJ/cm$^2$ using an exposure apparatus having a high pressure mercury lamp to thereby cause the radiation-sensitive compound contained in the resin film to completely break down. Next, an oven was used to heat this in a nitrogen atmosphere at 230° C. for 60 minutes for post-baking to obtain a resin film-coated board comprised of a resin film and silicon wafer board. The obtained resin film-coated board was designated as the "board A".

Further, the resin film of the obtained board A was irradiated with UV light for 15 minutes using a UV ozone washing apparatus (made by Technovision, "UV-208"). Further, due to this UV light irradiation process, the resin film formed on the board A was exposed to UV light and the ozone atmosphere generated by irradiation of UV light and therefore was placed in a relatively harsh oxidizing environment. Further, the resin film-coated board after this UV light irradiation process was designated as the "board B".

Next, the above obtained board A and board B were cut into 1 cm squares and measured for amounts of moisture generated from the films by the TDS method using a thermal desorption gas spectroscope (made by ESCO, "WA1000S/W"). At the time of measurement, the measurement was started from a temperature of 40° C. The temperature was raised by 60° C./min until 220° C., then was held at 220° C. for 30 minutes. The total amount of the moisture generated during this was measured. The amounts of water absorption of the board A and board B (units: wt ppm) were found from the total amounts of water absorption measured.

The lower the amount of water absorption of the board A (amount of water absorption after film formation), the lower the water absorption ability of the resin film and the more preferable the film can be evaluated as. Further, the lower the amount of water absorption of the board B (amount of water absorption after UV ozone treatment), the better the UV ozone treatment resistance and the more preferable the film can be evaluated as.

Synthesis Example 1

Preparation of Cyclic Olefin Polymer (A-1)

100 parts of a monomer mixture comprised of 40 mol % of N-phenyl-bicyclo[2.2.1]hept-5-ene-2,3-dicarboxyimide (NBPI) and 60 mol % of 4-hydroxycarbonyltetracyclo[6.2.1.1$^{3,6}$.0$^{2,7}$]dodec-9-ene (TCDC), 2.0 parts of 1,5-hexadiene, 0.02 part of (1,3-dimesitylimidazolin-2-ylidene) (tricyclohexylphosphine)benzylidene ruthenium dichloride (prepared by method described in Org. Lett., vol. 1, page 953, 1999), and 200 parts of diethyleneglycol ethylmethyl ether were charged into a glass pressure-resistant reactor with the inside substituted by nitrogen. The mixture was stirred while causing it to react at 80° C. for 4 hours to obtain a polymerization reaction solution.

Further, the obtained polymerization reaction solution was placed in an autoclave and stirred at 150° C. and a hydrogen pressure of 4 MPa for 5 hours for a hydrogenation reaction to obtain a polymer solution containing a cyclic olefin polymer (A-1). The polymerization conversion rate of the obtained cyclic olefin polymer (A-1) was 99.7%, the weight average molecular weight converted to polystyrene was 7,150, the number average molecular weight was 4,690, the molecular weight distribution was 1.52, and the hydrogenation rate was 99.7%. Further, the solids content concentration of the polymer solution of the obtained cyclic olefin polymer (A-1) was 34.4 wt %.

Synthesis Example 2

Preparation of Acrylic Resin (A-2)

20 parts of styrene, 25 parts of butyl methacrylate, 25 parts of 2-ethylhexyl acrylate, 30 parts of methacrylic acid, 0.5 part of 2,2-azobis isobutyronitrile, and 300 parts of propyleneglycol monomethyl ether acetate were stirred in a nitrogen stream while heating at 80° C. for 5 hours. The obtained resin solution was concentrated by a rotary evaporator to obtain a polymer solution of an acrylic resin (A-2) of a solids content concentration of 35 wt %.

Example 1

291 parts of a binder resin (A) comprised of a polymer solution of the cyclic olefin polymer (A-1) obtained in Synthesis Example 1 (100 parts as cyclic olefin polymer (A-1)), 30 parts of a radiation-sensitive compound (B) comprised of a condensate of 1,1,3-tris(2,5-dimethyl-4-hydroxyphenyl)-3-phenylpropane (1 mole) and 1,2-naphthoquinone diazide-5-sulfonic acid chloride (2.0 moles) (product name "TS200", made by Toyo Gosei), 5 parts of a cross-linking agent (C) comprised of tris(alkoxycarbonylamino)triazine ("Cymel NF2000", made by Daicel-Allnex, compound of formula (1) where $R^1$ to $R^3$=—$CH_3$, -n-$C_4H_9$), 10 parts of an epoxy compound (E) comprised of an epoxylated butane tetracarboxylic acid tetrakis(3-cyclohexenylmethyl)-modified ε-caprolactone (aliphatic cyclic 4-functional epoxy resin, product name "Epolide GT401", made by Daicel Chemical), 0.03 part of a silicone-based surfactant (product name "KP-341", made by Shin-Etsu Chemical), and 300 parts of a solvent comprised of ethyleneglycol ethylmethyl ether were mixed and made to dissolve, then the mixture was filtered by a pore-size 0.45 μm polytetrafluoroethylene filter to prepare a radiation-sensitive resin composition.

Further, the above obtained resin composition was used in accordance with the above methods to evaluate the exposure sensitivity, patternability by development (development residue), coefficient of water absorption, and UV ozone treatment resistance. The results are shown in Table 1.

Examples 2 and 3

Except for changing the amount of the tris(alkoxycarbonylamino)triazine from 5 parts to 15 parts (Example 2) and 25 parts (Example 3) respectively, the same procedure was followed as in Example 1 to prepare radiation-sensitive resin compositions and the same procedure was followed to evaluate them. The results are shown in Table 1.

Example 4

Except for not mixing in the epoxylated butane tetracarboxylic acid tetrakis(3-cyclohexenylmethyl)-modified ε-caprolactone, the same procedure was followed as in Example 2 to prepare a radiation-sensitive resin composition and the same procedure was followed to evaluate it. The results are shown in Table 1.

Example 5

Except for further mixing in 20 parts of a cross-linking agent (D) comprised of a triazine ring structure-containing compound containing an alkoxyalkyl group (product name "Nikalac MW-100LM", made by Sanwa Chemical, compound shown by the above general formula (6) ($R^9$ to $R^{14}$=—$CH_2OCH_3$), monomer concentration about 75%), the same procedure was followed as in Example 2 to prepare a radiation-sensitive resin composition and the same procedure was followed to evaluate it. The results are shown in Table 1.

Example 6

Except for further mixing in 10 parts of a cross-linking agent (D) comprised of a triazine ring structure-containing compound containing a methylol group and alkoxyalkyl group (product name "Nikalac MW-750LM", made by Sanwa Chemical, compound shown by the above general formula (6) ($R^9$=—H, $R^{10}$, $R^{12}$ to $R^{14}$=—$CH_2OCH_3$, $R^{11}$=—$CH_2OH$), monomer concentration about 40%), the same procedure was followed as in Example 2 to prepare a radiation-sensitive resin composition and the same procedure was followed to evaluate it. The results are shown in Table 1.

Examples 7 to 9

Except for changing the amount of the triazine ring structure-containing compound containing a methylol group and alkoxyalkyl group from 10 parts to 15 parts (Example 7), 20 parts (Example 8), and 50 parts (Example 9) respectively, the same procedure was followed as in Example 6 to prepare radiation-sensitive resin compositions and the same procedure was followed to evaluate them. The results are shown in Table 1.

Example 10

Except for using, instead of 291 parts of the polymer solution of the cyclic olefin polymer (A-1) obtained in Synthesis Example 1 (100 parts as cyclic olefin polymer (A-1)), 285 parts of the polymer solution of the acrylic resin (A-2) obtained in Synthesis Example 2 (100 parts as acrylic resin (A-2)), the same procedure was followed as in Example 8 to prepare a radiation-sensitive resin composition and the same procedure was followed to evaluate it. The results are shown in Table 1.

Comparative Examples 1 and 2

Except for changing the amount of the tris(alkoxycarbonylamino)triazine from 5 parts to 2.5 parts (Comparative Example 1) and 30 parts (Comparative Example 2) respectively, the same procedure was followed as in Example 1 to prepare radiation-sensitive resin compositions and the same procedure was followed to evaluate them. The results are shown in Table 1.

Comparative Example 3

Except for further mixing in 20 parts of a cross-linking agent (D) comprised of a triazine ring structure-containing compound containing an alkoxyalkyl group (product name "Nikalac MW-100LM", made by Sanwa Chemical), the same procedure was followed as in Comparative Example 2 to prepare a radiation-sensitive resin composition and the same procedure was followed to evaluate it. The results are shown in Table 1.

Comparative Example 4

Except for further mixing in 20 parts of a cross-linking agent (D) comprised of a triazine ring structure-containing compound containing a methylol group and alkoxyalkyl group (product name "Nikalac MW-750LM", made by Sanwa Chemical), the same procedure was followed as in Comparative Example 2 to prepare a radiation-sensitive resin composition and the same procedure was followed to evaluate it. The results are shown in Table 1.

Comparative Example 5

Except for not mixing in tris(alkoxycarbonylamino)triazine, the same procedure was followed as in Comparative Example 3 to prepare a radiation-sensitive resin composition and the same procedure was followed to evaluate it. The results are shown in Table 1.

Comparative Example 6

Except for not mixing in tris(alkoxycarbonylamino)triazine, the same procedure was followed as in Example 1 to prepare a radiation-sensitive resin composition and the same procedure was followed to evaluate it. The results are shown in Table 1.

TABLE 1

|  |  |  | Examples | | | | | | | | | |
|---|---|---|---|---|---|---|---|---|---|---|---|---|
|  |  |  | 1 | 2 | 3 | 4 | 5 | 6 | 7 | 8 | 9 |
| Composition of radiation-sensitive resin composition | | | | | | | | | | | | |
| Binder resin (A) | Cyclic olefin polymer (A-1) | (parts) | 100 | 100 | 100 | 100 | 100 | 100 | 100 | 100 | 100 |
|  | Acrylic resin (A-2) | (parts) | | | | | | | | | |
| Radiation-sensitive compound (B) | Condensate of 1,1,3-tris(2,5-dimethyl-4-hydroxyphenyl)-3-phenylpropane (1 mole) and 1,2-naphthoquinonediazide-5-sulfonic acid chloride (2.0 moles) (TS200) | (parts) | 30 | 30 | 30 | 30 | 30 | 30 | 30 | 30 | 30 |
| Cross-linking agent (C) | Tris(alkoxycarbonylamino)triazine (Cymel NF2000) | (parts) | 5 | 15 | 25 | 15 | 15 | 15 | 15 | 15 | 15 |
| Cross-linking agent (D) | Triazine ring structure-containing compound containing alkoxyalkyl group (Nikalac MW-100LM) | (parts) | | | | | | 20 | | | |
|  | Triazine ring structure-containing compound containing methylol group and alkoxyalkyl group (Nikalac MX-750LM) | (parts) | | | | | | | 10 | 15 | 20 | 50 |
| Epoxy compound (E) | Epoxylated butane tetracarboxylic acid tetrakis-(3-cyclohexenylmethyl)-modified ε-caprolactone (Epolide GT401) | (parts) | 10 | 10 | 10 | | 10 | 10 | 10 | 10 | 10 |
| Evaluation | | | | | | | | | | | | |
| Exposure sensitivity (mJ/cm$^2$) | | | 103 | 92 | 77 | 105 | 83 | 79 | 83 | 66 | 122 |
| Development residue (%) | | | 19.6 | 21.2 | 24.8 | 17.2 | 26.5 | 21.8 | 23.9 | 27.3 | 22.5 |
| Water absorption after film formation (wt ppm) | | | 88 | 50 | 39 | 54 | 30 | 44 | 31 | 27 | 28 |
| Water absorption after UV ozone treatment (wt ppm) | | | 493 | 353 | 292 | 394 | 244 | 339 | 315 | 213 | 198 |
| Increase of water absorption due to UV ozone treatment (wt ppm) | | | 405 | 303 | 253 | 340 | 214 | 295 | 284 | 186 | 170 |

|  |  |  | Examples | Comparative examples | | | | | |
|---|---|---|---|---|---|---|---|---|---|
|  |  |  | 10 | 1 | 2 | 3 | 4 | 5 | 6 |
| Composition of radiation-sensitive resin composition | | | | | | | | | |
| Binder resin (A) | Cyclic olefin polymer (A-1) | (parts) | | 100 | 100 | 100 | 100 | 100 | 100 |
|  | Acrylic resin (A-2) | (parts) | 100 | | | | | | |
| Radiation-sensitive compound (B) | Condensate of 1,1,3-tris(2,5-dimethyl-4-hydroxyphenyl)-3-phenylpropane (1 mole) and 1,2-naphthoquinonediazide-5-sulfonic acid chloride (2.0 moles) (TS200) | (parts) | 30 | 30 | 30 | 30 | 30 | 30 | 30 |
| Cross-linking agent (C) | Tris(alkoxycarbonylamino)triazine (Cymel NF2000) | (parts) | 15 | 2.5 | 30 | 30 | 30 | | |
| Cross-linking agent (D) | Triazine ring structure-containing compound containing alkoxyalkyl group (Nikalac MW-100LM) | (parts) | | | | | 20 | | 20 |
|  | Triazine ring structure-containing compound containing methylol group and alkoxyalkyl group (Nikalac MX-750LM) | (parts) | 20 | | | | | 20 | |
| Epoxy compound (E) | Epoxylated butane tetracarboxylic acid tetrakis-(3-cyclohexenylmethyl)-modified ε-caprolactone (Epolide GT401) | (parts) | 10 | 10 | 10 | 10 | 10 | 10 | 10 |
| Evaluation | | | | | | | | | |
| Exposure sensitivity (mJ/cm$^2$) | | | 98 | 167 | not mesurable | not mesurable | 243 | 198 | 213 |
| Development residue (%) | | | 15.1 | 8.6 | | | 7.9 | 3.9 | 5.5 |
| Water absorption after film formation (wt ppm) | | | 35 | 127 | 39 | 39 | 35 | 108 | 105 |
| Water absorption after UV ozone treatment (wt ppm) | | | 403 | 1392 | 281 | 241 | 209 | 1121 | 1967 |
| Increase of water absorption due to UV ozone treatment (wt ppm) | | | 368 | 1265 | 242 | 202 | 174 | 1013 | 1862 |

Note that, in Table 1, "increase of water absorption by UV ozone treatment" is "increase of water absorption by UV ozone treatment"="water absorption after UV ozone treatment"−"water absorption after film formation".

As shown in Table 1, the resin film obtained using a radiation-sensitive resin composition comprising the binder resin (A), radiation-sensitive compound (B), and cross-linking agent (C) represented by the above general formula (1) and having a content of the cross-linking agent (C) of 3 to 25 parts by weight in range with respect to 100 parts by weight of the binder resin (A) was high in exposure sensitivity, suppressed in development residue, excellent in patternability by development, low in coefficient of water absorption, and excellent in UV ozone treatment resistance (Examples 1 to 10).

On the other hand, when not mixing in the cross-linking agent (C) or when the amount of the cross-linking agent (C) was too small, the obtained resin film was low in exposure sensitivity, high in coefficient of water absorption, or inferior in patternability by development and UV ozone treatment resistance (Comparative Examples 1, 5, and 6).

Further, if the amount of the cross-linking agent (C) was too large, the obtained resin film was inferior in patternability by development (Comparative Examples 2 to 4). In particular, in Comparative Examples 2 and 3, the patternability by development was remarkably poor, the resin film ended up peeling off at the time of development, and the exposure sensitivity and development residue could not be evaluated.

The invention claimed is:
1. A radiation-sensitive resin composition comprising a binder resin (A), quinone diazide compound (B), cross-linking agent (C) represented by the following general formula (1), cross-linking agent (D) and epoxy compound (E), wherein
    the cross-linking agent (D) has a triazine ring structure or glycoluril structure and has one or more types of functional groups selected from a group consisting of a methylol group and alkoxyalkyl group,
    the epoxy compound (E) is a polyfunctional epoxy compound having an alicyclic structure
    a content of the epoxy compound (E) is 3 to 70 parts by weight with respect to 100 parts by weight of the binder resin (A),
a content of the cross-linking agent (C) is 3 to 25 parts by weight with respect to 100 parts by weight of the binder resin (A), and
    a content of the cross-linking agent (D) is 15 to 45 parts by weight with respect to 100 parts by weight of the binder resin (A):

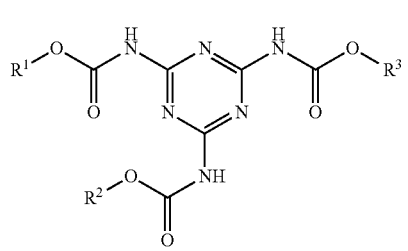

(1)

wherein, in the general formula (1), each of $R^1$ to $R^3$ independently represents a hydrocarbon group having 1 to 10 carbon atoms.

2. The radiation-sensitive resin composition according to claim 1 wherein in the general formula (1), each of $R^1$ to $R^3$ is a methyl group and/or n-butyl group.

3. The radiation-sensitive resin composition according to claim 1 wherein the cross-linking agent (D) is a compound having a melamine structure represented by the following general formula (6) and/or a compound having a guanamine structure represented by the following general formula (7):

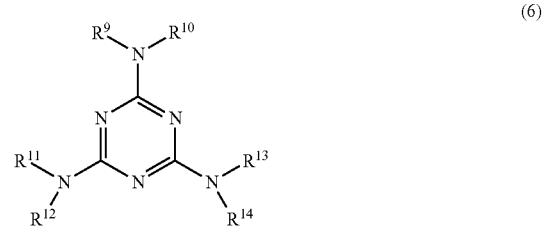

(6)

wherein, in the general formula (6), each of $R^9$ to $R^{14}$ independently represents a hydrogen atom, substituted or unsubstituted alkyl group, substituted or unsubstituted aryl group, methylol group, or alkoxyalkyl group, among $R^9$ to $R^{14}$, at least one being a methylol group or alkoxyalkyl group:

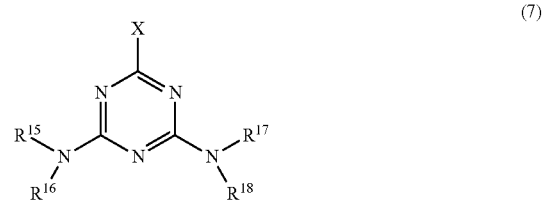

(7)

wherein, in the general formula (7), each of $R^{15}$ to $R^{18}$ independently represents a hydrogen atom, substituted or unsubstituted alkyl group, substituted or unsubstituted aryl group, methylol group, or alkoxyalkyl group, among $R^{15}$ to $R^{18}$, at least one being a methylol group or alkoxyalkyl group, X represents a hydrogen atom, substituted or unsubstituted alkyl group, or substituted or unsubstituted aryl group.

4. The radiation-sensitive resin composition according to claim 1 wherein a content of the epoxy compound (E) is 10 to 70 part by weight with respect to 100 parts by weight of the binder resin (A).

5. The radiation-sensitive resin composition according to claim 1 wherein the content of the cross-linking agent (C) is 10 to 25 parts by weight with respect to 100 parts by weight of the binder resin (A).

6. A resin film obtained using the resin composition according to claim 1.

7. An electronic device provided with the resin film according to claim 6.

* * * * *